United States Patent [19]

Mather

[11] Patent Number: 5,243,145

[45] Date of Patent: Sep. 7, 1993

[54] PACKAGE STRUCTURE FOR MULTICHIP MODULES

[75] Inventor: John C. Mather, Cedar Rapids, Iowa

[73] Assignee: Rockwell International Corporation, Seal Beach, Calif.

[21] Appl. No.: 903,424

[22] Filed: Jun. 24, 1992

[51] Int. Cl.$^5$ .............................................. H01L 23/02
[52] U.S. Cl. .................................. 174/52.4; 257/678; 361/829; 361/728
[58] Field of Search ............... 174/52.1, 52.2, 52.3, 174/52.4; 361/392, 394, 395, 397, 399, 429; 257/678, 690, 693, 704; 29/882, 884

[56] References Cited

U.S. PATENT DOCUMENTS 4,991,291  2/1991  Koepke et al. ..................... 29/884

*Primary Examiner*—Leo P. Picard
*Assistant Examiner*—Bot Lee Ledynh
*Attorney, Agent, or Firm*—M. Lee Murrah; V. Lawrence Sewell; H. Frederick Hamann

[57] ABSTRACT

A package for enclosing and mounting a multichip module to a printed wiring board including a ceramic base with an elevated peripheral ledge constructed of a material, having a coefficient of thermal expansion differing substantially from the coefficient of thermal expansion of the material of a serpentine sidewall mounted to the base, and having a lid mounted to the top of the sidewall. The package includes electrical contacts extending through the ledge for connecting the multichip module to the circuit board. The sidewall is a series of interconnected short segments having acute angles at their interconnection forming a pleated shape.

11 Claims, 3 Drawing Sheets

PACKAGE STRUCTURE FOR MULTICHIP MODULES

BACKGROUND OF THE INVENTION

The present invention relates to mounting structures for integrated circuit chips and more particularly to packages for mounting multichip modules on printed wiring boards.

It has become increasingly common to use multichip modules to mount subassemblies of integrated circuit chips on printed wiring boards. Such modules frequently include several integrated circuit chips supported on a planar silicon base which includes a fine-line multilayer structure for electrically interconnecting the chips. Most multichip modules are enclosed within packages which are intended to protect them from adverse environmental influences such as moisture and to allow for the modules to be mechanically attached and electrically connected to wiring boards. In the past, the packages for multichip modules have generally been metal or ceramic casings of the type used in thick and thin film hybrid microelectronics having small apertures within their side walls for allowing glass encapsulated leads to pass through the walls of the casings. The leads have served both to mechanically attach the package to the circuit board and electrically connect the module to the circuit board. The performance of such packages has been poor due to the delicate nature of this method of mechanical attachment and mismatches between the coefficients of thermal expansion of the components of the package and the circuit board on which the package is mounted.

Multichip module packages typically use a base to which four walls are applied, with a metal lid secured to the top of the sidewalls. The base and walls are usually made from the same material, and the lid may be of a different material: e.g., ceramic base and walls, and a KOVARTM TM lid. In these packages, close attention is paid to thermal expansion compatibility between the materials being used.

In many situations, it has become desirable to create alternative package configurations, wherein the sidewalls and the base may be made from different materials. An example of this might be a multichip package made from an aluminum nitride ceramic base and metal walls.

Matching of thermal expansion may be difficult; particularly over the wide temperature range typically used in brazing package parts together. In most cases, a modest thermal expansion mismatch can be accommodated over short distances. However, thermal expansion mismatch cannot usually be tolerated where longer distances are encountered, such as along one side of a package sidewall. When thermal expansion mismatch is possible, the fixation joint between metal sidewall elements and ceramic base will become mechanically stressed and subject to fracture or warpage.

SUMMARY OF THE INVENTION

The present invention constitutes an improved package for a multichip module in which separate mechanisms are provided for mechanically attaching the package to a printed wiring board and for electrically connecting the package to the printed wiring board to which it is attached. The package includes a ceramic base on which the multichip module is supported, an endless sidewall of short segments and a lid for covering the top of the package and sealing it off from environmental influences. The package also includes a set of electrical leads extending from the interior to the exterior of the package for providing multiple separate connections between the multichip module and the printed wiring board on which it is mounted. In the preferred embodiment, the ceramic base is a co-fired construction including a ledge extending around its perimeter having a number of electrical contact feedthroughs extending through it from the interior to the exterior of the base.

An endless metal sidewall is fixed atop the peripheral ledge by brazing or soldering, and a metal lid is seam-sealed to the top of the sidewall. To accommodate the differences in thermal expansion characteristics between the ceramic ledge and the metal sidewall, the sidewall comprises a band of multiple short segments separated by vertical creases, thereby creating a pleated wall, which permits modest thermal expansion mismatch since only short distances are involved with each pleat. Adjacent segments of the wall are preferably related at acute angles, thereby providing a compliant "hinge" between segments. Each individual segment or pleat is short enough that modest expansion rate differences between the sidewall material and the package base are readily accommodated within the metallurgical joint. The pleated sidewall is flexible enough along the direction of the package edge that modest thermal expansion mismatch over large distances can be accommodated without imposing significant stresses on either component or on the bond which joins them.

The use of a pleated sidewall permits use of thinner materials for package walls, and may provide stiffness improvement while lowering overall package weight. In addition, this approach likely permits continued use of established seam-sealing techniques used to join lids to sidewalls after electronics are placed within the cavity of the package.

It is therefore an object of the invention to provide a package for a multichip module which allows the use of components which are mismatched in coefficient of thermal expansion.

It is a further object of the invention to provide a package for a multichip module which allows the use of established metal components with ceramic base components having low coefficient of thermal expansion.

It is a further object of the invention to provide a package for a multichip module which may be reliably manufactured without joint stress fracture or warpage.

It is a further object of the invention to provide a package for a multichip module having thinner sidewalls and less total package weight.

It is a further object of the invention to provide a package for a multichip module which has the above referenced desirable characteristics yet is economical to manufacture for applications where full hermeticity is required.

DESCRIPTION OF THE DRAWINGS FIGURES

DETAILED DESCRIPTION OF THE INVENTION

Figure 1:
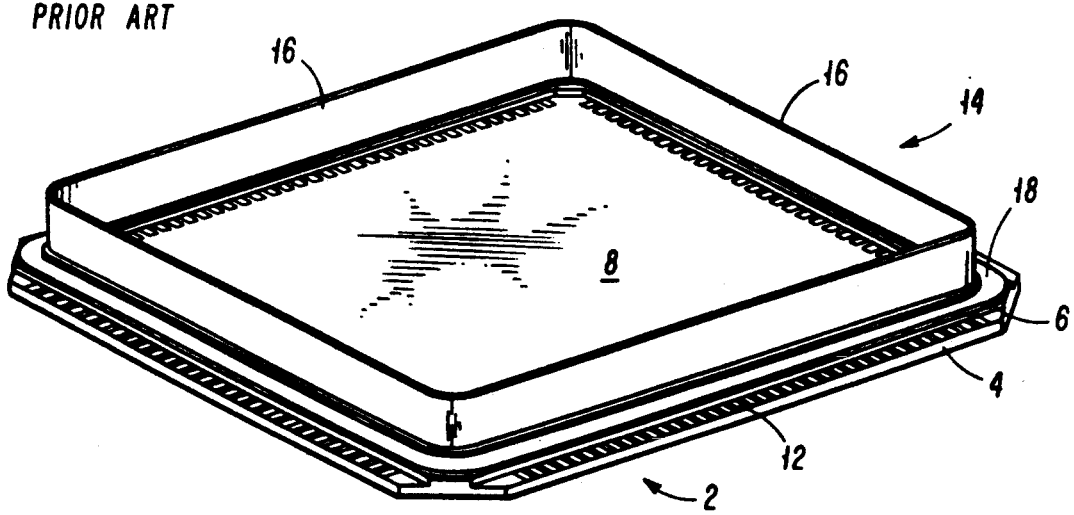
FIG. 1 is a front perspective view of an existing form of multichip module package with the lid omitted.

Referring to FIG. 1, a prior art multichip module package 2 is shown without the enclosing lid structure. A planar base 4 of a ceramic material, typically aluminum oxide or aluminum nitride, is constructed to include a ledge 6 extending around the perimeter of base 4 which is elevated from the top surface 8 of base 4. Base 4 includes a very thin metalized layer along its top surface, and contacts 12 which pass between ledge 6 and base 4 across the width of ledge 6 into top surface 8. The ledge 6, contacts 12 and metalized layer are integral to the base 4, being part of a single co-fired construction.

A collar 14 having vertical walls 16 and a horizontal sill 18 adapted for engaging ledge 6 of the base 4 is positioned atop surface 8, although some packages do not use a sill 18. Collar 14 is preferably constructed of an iron-nickel alloy which is matched to the thermal expansion characteristics of base 4. Collar 14 is attached to the top of ledge 6 around the perimeter of base 4 by brazing or soldering. When soldering is used, temperatures are normally sufficiently low to avoid thermal expansion mismatch when some materials are used and thus to permit use of a straight sidewalled metal collar 14. However, in many cases, especially where brazing is used, thermal expansion in collar 14 is so great that the standard sidewall configuration cannot be used.

Figure 2:
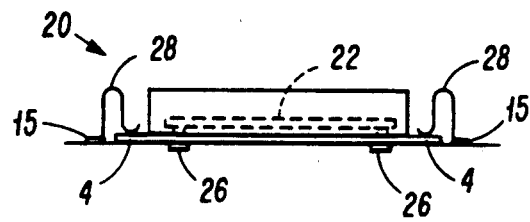
FIG. 2 is an elevational view of a package for a multichip module in accordance with the present invention as it would be mounted on a printed wiring board.

Referring to FIG. 2, the present invention may be used in a packaging configuration comprising a package 20 for mounting a multichip module 22 on a printed circuit board 24 to mechanically secure and electrically connect multichip module 22 to circuit board 24. The mechanical connection between package 20 and circuit board 24 is accomplished by means of a set of bolts 26 which extend up through the circuit board 24 and engage the package 20. The electrical connection between package 20 and circuit board 24 is accomplished by means of a set of arcuately-shaped leads 28 which extend out from base 4 and soldered to electrical pads 15 that are built into circuit board 24.

Figure 4:
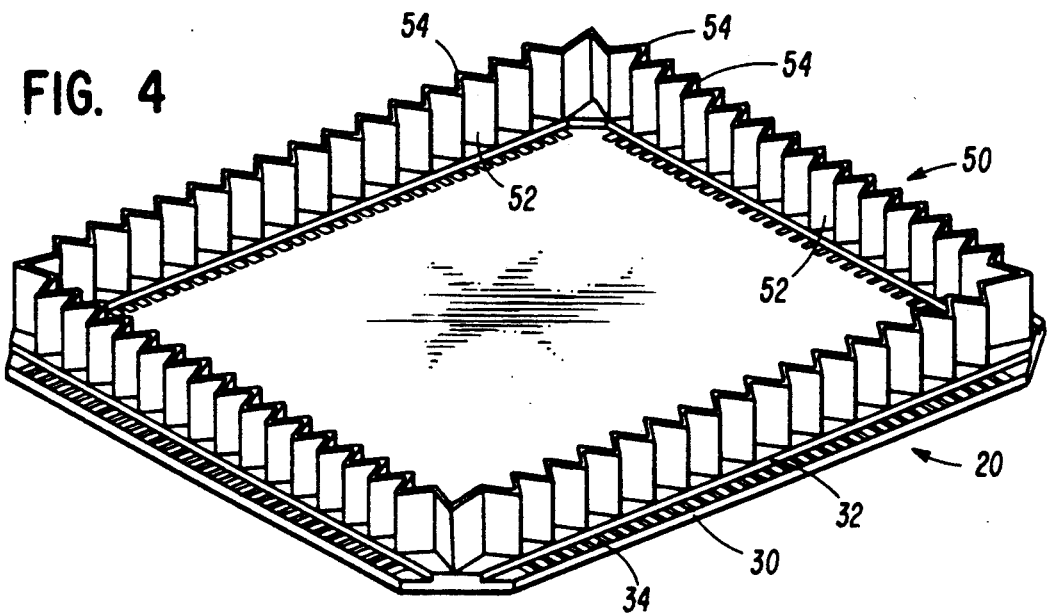
FIG. 4 is a front perspective view of an enclosure for a package for a multichip module according to a preferred embodiment of the present invention with the lid for the package omitted.
Figure 3:
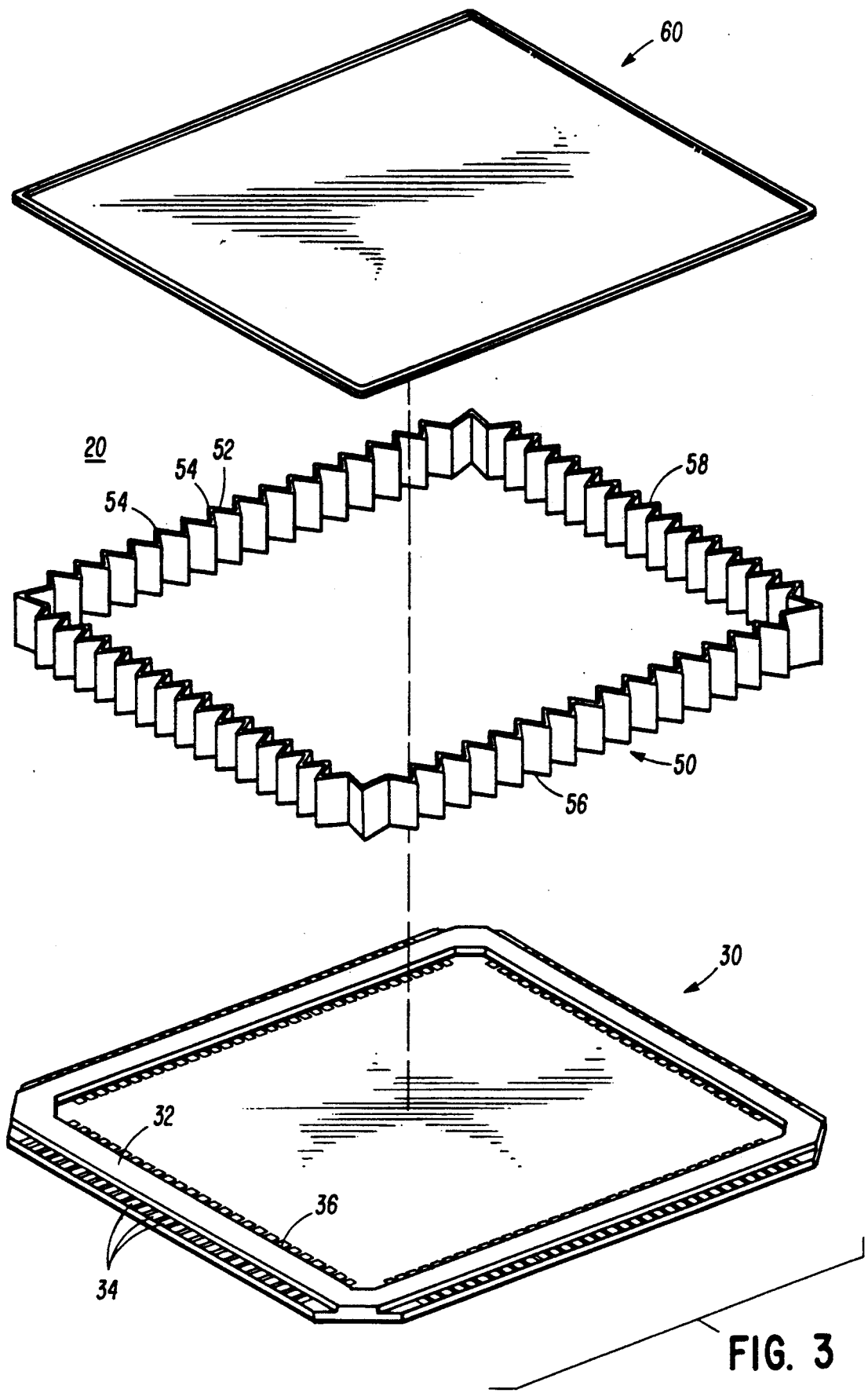
FIG. 3 is an exploded view of a package for a multichip module in accordance with the present invention corresponding to a preferred embodiment which provides tolerance of modest thermal expansion variances in the components of the package.

Referring now to FIGS. 3 and 4, a preferred embodiment of the present invention is shown in the form of a hermetic package 20 which is adapted for sealing off a multichip module from environmental influences and thus protecting the module and the chips mounted thereon from the adverse effects of exposure to moisture and the like. Package 20 includes a planar ceramic base 30 constructed of a material such as aluminum nitride having thermal expansion characteristics similar to the silicon used in a multichip module and having good thermal conductivity for promoting transfer of heat away from the module during operation.

A multichip module may be attached to base 30 by a thermally conductive adhesive. Ceramic base 30 is specially constructed to include a ledge 32 which extends around the perimeter of the base, and which is elevated from the surface of the base 30. A multiplicity of metalized contacts 34 operative as electrical feed-throughs extend through and under ledge 32 from the interior to the exterior of base 30. Ledge 32 includes a very thin metalized layer 36 all along its top surface. Ledge 32, contacts 34, and metalized layer 36 are integral to base 30, being part of a single co-fired construction which provides a particularly durable structure.

Package 20 also includes an endless sidewall 50 which is adapted at its lower edge 56 for engagement with ledge 32. Sidewall 50 is most advantageously constructed of a metal alloy, which, in the preferred embodiment is an iron-nickel alloy known commercially as KOVAR ™ alloy, which has a coefficient of thermal expansion of approximately six parts per million per degree centigrade. While the thermal expansion characteristics of KOVAR ™ are not dissimilar from aluminum oxide, they do vary from aluminum nitride, the preferred ceramic for base 30, which has a coefficient of thermal expansion of approximately three parts per million per degree centigrade.

Sidewall 50 comprises a series of short wall segments 52 separated by substantially vertical bends 54 to form a pleated structure. Each wall segment 52 is short relative to the overall length of a side of package 20. The use of this novel sidewall structure should allow the brazing of sidewall 50 to the ledge 32 of base 30 at temperatures in the range of 800 degrees centigrade.

Sidewall 50 may be made from a continuous annular section of seamless rectangular metal tubing formed by transversely by cutting the tubing perpendicular to its axis. After the tubing section is taken, it may be formed by bending into a rectangular band of short segments 52. Because differing forms may be used to create different quantities and sizes of short segments 52 of sidewall 50, a single metal tubing may be used to form sidewalls for different sizes or shapes of package 20.

Figure 5:
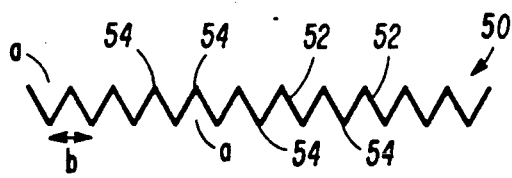
FIG. 5 is a plan view of a section of sidewall of a package for a multichip module in accordance with a preferred embodiment of the present invention.

Referring to FIG. 5, a length of sidewall 50 is shown in a plan view. Short segments 52 are separated by bends 54, and each pair of adjacent segments 52 creates an acute angle "a" between them. Because short segments 52 are separated by bends 54, the metal band is weakened at bends 54, allowing flexure in the direction of arrow "b" among the short segments 52 of sidewall 50. The distance between adjacent bends 54 is short enough to accommodate expansion rate differences between the metal of sidewall 50 and the ceramic of base 30.

Pleated sidewall 50 is flexible enough in the direction of any edge of package 20 that thermal expansion mismatches over large distances are accommodated without imposing significant stresses on either sidewall 50 or base 30 or at the bond between lower edge 56 of sidewall 50 and ledge 32 of base 30.

Package 20 further includes a planar lid 60 adapted for mating with upper edge 58 of sidewall 50 and covering the interior of package 20 when secured thereto. Lid 60 is preferably constructed of the same iron-nickel alloy as sidewall 50 and may be sealed by soldering or seam-welding to sidewall 50 all the way around the perimeter of sidewall 50 to effect a hermetic seal.

Figure 6:
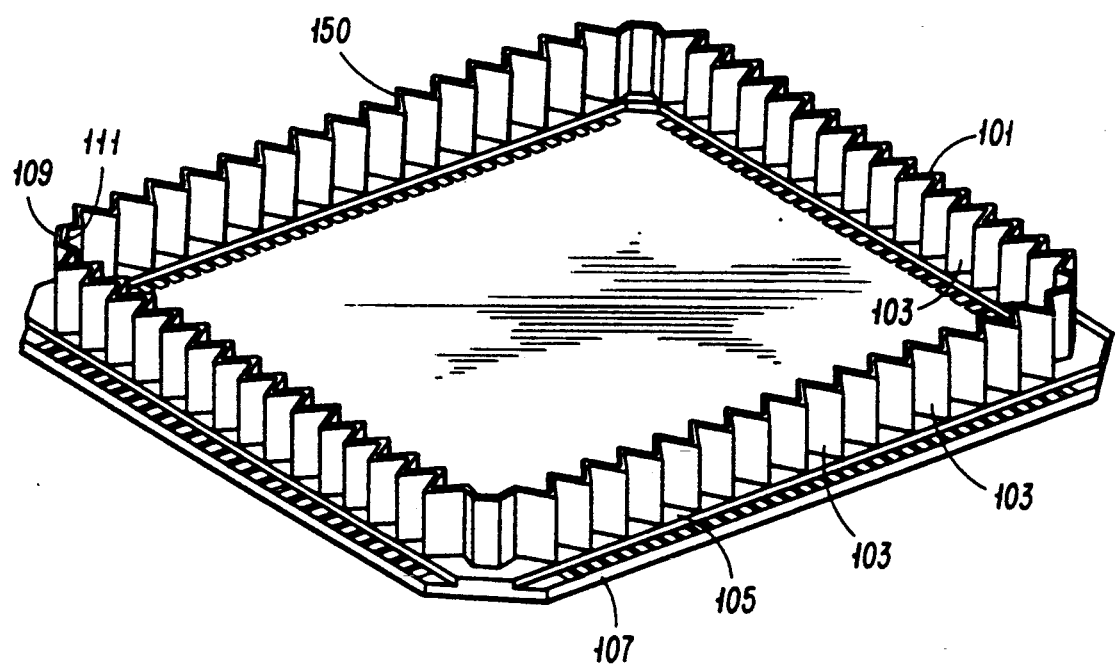
FIG. 6 is a front perspective view of a package for a multichip module in accordance with the present invention corresponding to an alternative embodiment.

In an alternative embodiment of the invention shown in FIG. 6, sidewall 150 comprises a two-ended band 101 of relatively short pleats 103 which are serially formed as band 101 is fed through a toothed bending apparatus. Band 101 is then formed into a suitably-sized rectangular sidewall 150 and placed in registry with perimetric ledge 105 of base 107. First end 109 of band 101 may overlap or be overlapped by second end 111 and welded or otherwise secured thereto to form an endless sidewall.

By use of the methodology and structure disclosed herein, it is possible to select from a wider range of suitable materials for the choice for package sidewall 50 since matching of thermal expansion coefficient of components of the package to be joined is less critical due to the accommodation characteristics of the novel structure of sidewall 50.

While particular embodiments of the present invention have been shown and described, it should be clear that changes and modifications may be made to such embodiments without departing from the true scope and spirit of the invention. It is intended that the appended claims cover all such changes and modifications.

I claim:

1. A package mountable on a printed wiring board for enclosing a multiplicity of interconnected electronic components, comprising:
    a planar base for receiving the electronic components; said base having electrical conductors embedded therein for carrying signals to and from said electrical components;
    a continuous sidewall whose lower edge abuts the base, said sidewall being formed into a multiplicity of non-aligned segments for accommodating differing thermal expansion rates in the materials comprising said base and said sidewall; and
    a planar lid abutting the upper edge of the sidewall.

2. The package as described in claim 1 wherein said sidewall is comprised of a multiplicity of short linear segments interconnected at acute angles.

3. The package as described in claim 2 wherein the periphery of said planar base is provided with a ledge having electrical contacts thereon connected to selected ones of said electrical conductors.

4. The package as described in claim 3 wherein said electronic components are integrated circuit chips.

5. The package as described in claim 1 wherein said base and said sidewalls are comprised of different materials.

6. The package as described in claim 5 wherein said base is comprised of a ceramic material.

7. The package as described in claim 6 wherein said sidewalls are comprised of a metallic material.

8. The package as described in claim 7 wherein said base is comprised of a ceramic material and said sidewalls are comprised of a metallic material.

9. The package as described in claim 5 wherein said base is comprised of aluminum nitride and said sidewalls are comprised of an iron-nickel alloy.

10. A package mountable on a printed wiring board for enclosing a multiplicity of interconnected integrated circuit chips, comprising:
    a planar base for receiving the electronic components, said base including electrical conductors embedded therein for carrying signals to and from said electronic components;
    a continous sidewall whose lower edge abuts the base, said sidewall being formed into a multiplicity of short linear segments interconnected at acute angles for accommodating differing thermal expansion rates in the materials comprising said base and said sidewall; and
    a planar lid abutting the upper edge of the sidewall.

11. The package as described in claim 10 wherein the periphery of said planar base is provided with a ledge having electrical contacts thereon connected to selected ones of said electrical conductors.

* * * * *